United States Patent
Jung et al.

(10) Patent No.: US 9,446,571 B2
(45) Date of Patent: Sep. 20, 2016

(54) TOUCH PANEL AND METHOD OF MANUFACTURING TOUCH PANEL

(71) Applicant: Samsung Display Co., Ltd., Yongin (KR)

(72) Inventors: Sung-Ki Jung, Busan (KR); Jung-Hyun Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/303,362

(22) Filed: Jun. 12, 2014

(65) Prior Publication Data

US 2015/0130746 A1    May 14, 2015

(30) Foreign Application Priority Data

Nov. 12, 2013  (KR) .......................... 10-2013-0137147

(51) Int. Cl.
*B32B 37/02*    (2006.01)
*B32B 37/00*    (2006.01)
(Continued)

(52) U.S. Cl.
CPC ........ *B32B 37/025* (2013.01); *B32B 2037/243* (2013.01); *B32B 2310/0831* (2013.01); *B32B 2457/20* (2013.01); *H01L 27/323* (2013.01); *Y10T 156/10* (2015.01)

(58) Field of Classification Search
CPC ..... B32B 37/025; B32B 37/24; B32B 38/10; B32B 2037/246; B32B 2457/208; B32B 2037/243; B32B 2457/20; B32B 2310/0831; G06F 3/03–3/047; G06F 3/0412; G06F 3/044; G06F 2203/04111; G06F 3/0414; G06F 2203/04103; G06F 2457/208; H01L 27/323; G02F 1/13439; G02F 1/13338; H03K 17/962; H03K 2217/960755; H01B 1/24; Y10T 156/10
USPC ....................... 345/174; 156/247, 275.5, 260
See application file for complete search history.

(56) References Cited

U.S. PATENT DOCUMENTS 8,409,366 B2 * 4/2013 Ogihara ............ H01L 21/02378
                                                    117/106
9,292,141 B2 * 3/2016 Zhong .................... G06F 3/044
(Continued)

FOREIGN PATENT DOCUMENTS

JP    2009-200177    *  9/2009 ............. H01L 21/02
JP    2012-218330       11/2012
(Continued)

OTHER PUBLICATIONS

Machine translation, Yoon, Korean Pat. Pub. No. 10-2013-0060005, translation date: May 12, 2015, KIPO, all pages.*

(Continued)

*Primary Examiner* — Victoria K Hall
(74) *Attorney, Agent, or Firm* — H.C. Park & Associates, PLC

(57) ABSTRACT

A manufacturing method of a touch panel includes: forming a graphene electrode on a metal substrate; adhering a transfer film on the graphene electrode; patterning the metal substrate to form electrode wiring; adhering a base substrate under the electrode wiring; and removing the transfer film. In the manufacturing method, the metal layer used when forming the graphene electrode is not removed after forming the graphene, and the metal layer is patterned to be used as the electrode wiring, such that the removal process of the metal layer and the forming process of the electrode wiring are unified into one. Accordingly, in the manufacturing process of the touch panel using the graphene as the transparent electrode, the manufacturing process is simplified.

9 Claims, 14 Drawing Sheets

(51) Int. Cl.
*H01L 27/32* (2006.01)
*B32B 37/24* (2006.01)

(56) References Cited

U.S. PATENT DOCUMENTS

| | | | | |
|---|---|---|---|---|
| 9,327,982 | B2* | 5/2016 | Kub | C01B 31/0446 |
| 9,337,274 | B2* | 5/2016 | Dimitrakopoulos | H01L 29/1606 |
| 2010/0059899 | A1* | 3/2010 | Sakurai | G06K 19/07728 |
| | | | | 257/787 |
| 2010/0224851 | A1* | 9/2010 | Colombo | H01L 21/02612 |
| | | | | 257/9 |
| 2010/0323164 | A1* | 12/2010 | Ogihara | H01L 21/2007 |
| | | | | 428/156 |
| 2011/0048625 | A1* | 3/2011 | Caldwell | B82Y 30/00 |
| | | | | 156/233 |
| 2011/0104442 | A1* | 5/2011 | Yoon | B82Y 30/00 |
| | | | | 428/152 |
| 2011/0108521 | A1* | 5/2011 | Woo | B82Y 30/00 |
| | | | | 216/36 |
| 2011/0206934 | A1* | 8/2011 | Bol | B82Y 30/00 |
| | | | | 428/408 |
| 2012/0248401 | A1* | 10/2012 | Shin | H01L 21/02527 |
| | | | | 257/9 |
| 2012/0282419 | A1* | 11/2012 | Ahn | B82Y 30/00 |
| | | | | 428/34.8 |
| 2012/0298623 | A1* | 11/2012 | Jiang | H04R 23/002 |
| | | | | 216/33 |
| 2012/0319976 | A1* | 12/2012 | Ahn | G06F 3/045 |
| | | | | 345/173 |
| 2013/0022811 | A1 | 1/2013 | Ahn et al. | |
| 2013/0098540 | A1* | 4/2013 | Lee | H01L 29/42384 |
| | | | | 156/230 |
| 2013/0206227 | A1* | 8/2013 | Shimizu | H01G 9/2022 |
| | | | | 136/256 |
| 2014/0151325 | A1* | 6/2014 | Baek | G06F 3/044 |
| | | | | 216/13 |
| 2015/0077361 | A1* | 3/2015 | Seo | B60R 1/088 |
| | | | | 345/173 |

FOREIGN PATENT DOCUMENTS

| | | | | |
|---|---|---|---|---|
| KR | 10-1132706 | | 4/2012 | |
| KR | 10-2013-0060005 | | 6/2013 | |
| KR | 10-2013-0079051 | | 7/2013 | |
| KR | 10-1284535 | | 7/2013 | |
| WO | WO 2011096700 | * | 8/2011 | G06F 3/045 |

OTHER PUBLICATIONS

Machine translation, Terrazono, Japanese Pat. Pub. No. 2012-218330, translation date: Mary 12, 2015, JPO & Japio, all pages.*
Machine translation, Kim, Korean Pat. No. 10-1284535, translation date: May 12, 2015, KIPO, all pages.*
Machine translation, Cho, Korean Pat. No. 10-1132706, translation date: May 12, 2015, KIPO, all pages.*
Machine translation, Oshima, Japanese Pat. Pub. No. 2009-200177, translation date: Sep. 3, 2015, JPO & Japio, all pages.*
Machine translation, Lee, Korean Pat. Pub. No. 10-2013-0079051, translation date: May 12, 2015, KIPO, all pages.*

* cited by examiner

TOUCH PANEL AND METHOD OF MANUFACTURING TOUCH PANEL

CROSS REFERENCE TO RELATED APPLICATION

This application claims priority to and the benefit of Korean Patent Application No. 10-2013-0137147, filed on Nov. 12, 2013, which is hereby incorporated by reference for all purposes as if fully set forth herein.

BACKGROUND

1. Field

Exemplary embodiments of the present invention relate to a touch panel and a manufacturing method of a touch panel.

2. Discussion of the Background

With the development of computer technologies and digital techniques, peripheral assistance devices have also been developed. Users of personal computers, portable data transfer devices, and other personal information processing devices perform text processes and graphics processes by using various input devices, such as a keyboard and a mouse.

Use of computers is expanding day by day due to the rapid growth of an information-oriented society. Currently, however, there is difficulty in realizing efficient user driving of computerized device by only using the keyboard and the mouse as the input devices. Accordingly, the necessity for a device capable of easily inputting information that has a simple and low-error operation has increased.

As a response to this need, an input device has been developed having superior reliability, durability, innovation, design, and processing related techniques. That is, a touch panel has been realized as an input device capable of inputting information such as text and graphics.

The touch panel is used on a display surface of an image display device, such as a flat display device of an electronic notebook, a liquid crystal display (LCD), a plasma display panel (PDP), and electroluminescent (EL) display, or a cathode ray tube (CRT), and is a tool used to select desired information while a user views the image display device.

Touch panels are divided into a resistive type, a capacitive type, an electro-magnetic type, a surface acoustic wave (SAW) type, and an infrared type. The type of touch panel is selected for use in an electronic device by considering signal amplification, a resolution difference, difficulty of design and processing, optical characteristics, electronic characteristics, mechanical characteristics, inner characteristics, input characteristics, durability, and economy. Currently, the capacitive type of touch panel is most widely applied in the field.

In the case of the capacitive type of touch panel, an upper substrate formed with a first transparent electrode and a lower substrate formed with a second transparent electrode are spaced apart from each other with an insulating member not contacting the first transparent electrode and the second transparent electrode therebetween. Further, the upper substrate and the lower substrate include electrode wiring connected to the transparent electrode. The electrode wiring transmits a change of a capacitance generated in the first transparent electrode and the second transparent electrode to a controller as the touchscreen is contacted for input.

Conventionally, the transparent electrode is formed by using ITO (indium tin oxide) or a conductive polymer such as polyethylene dioxythiophene (PEDOT)/polystyrene sulfonate (PSS). In the case of ITO, electrical conductivity is excellent, however, indium as a raw material is an expensive rare earth metal, and exhaustion thereof is predicted in the next 10 years. Thus, soon, supply may be outweighed by demand. The conductive polymer as a material provided to substitute for ITO has excellent flexibility and is easily processed; however, its electrical conductivity is low.

Recently, an attempt has been made to use a graphene as the transparent electrode of the capacitive type touch panel. However, when using the graphene as the transparent electrode, additional process steps involving graphene growth and an electrode forming are needed, such that the manufacturing process is more complicated.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a shortened manufacturing method of a touch panel by patterning and using a metal catalytic layer without removal when forming graphene as electrode wiring in transparent electrode, and a touch panel manufactured thereof.

Additional features of the invention will be set forth in the description which follows, and in part will be apparent from the description, or may be learned by practice of the invention.

A manufacturing method of a touch panel according to an exemplary embodiment of the present invention includes: forming a graphene electrode on a metal substrate; adhering a transfer film on the graphene electrode; patterning the metal substrate to form electrode wiring; adhering a base substrate under the electrode wiring; and removing the transfer film.

A manufacturing method according to an exemplary embodiment of the present invention also includes: forming a graphene electrode on a metal substrate; adhering a base substrate on the graphene electrode; and patterning the metal substrate to form electrode wiring.

A touch panel according to an exemplary embodiment of the present invention includes: a base substrate; an adhesive layer formed on the base substrate; electrode wiring formed on the adhesive layer; and a graphene electrode formed on the electrode wiring, wherein the electrode wiring is made of a metal, one end of the electrode wiring is connected to the graphene electrode, and the electrode wiring progresses according to an edge of the base substrate and is grouped to one side.

A touch panel according to another exemplary embodiment of the present invention includes: a base substrate; an adhesive layer formed on the base substrate; a graphene electrode formed on the adhesive layer; and metal electrode wiring formed on the graphene electrode, wherein the electrode wiring is made of a metal, one end of the electrode wiring is connected to the graphene electrode, and the electrode wiring progresses according to an edge of the base substrate and is grouped to one side.

A display device according to still another exemplary embodiment of the present invention includes: a display panel including an upper substrate and a lower substrate; an adhesive layer formed on the display panel; electrode wiring formed on the adhesive layer; and a graphene electrode formed on the electrode wiring, wherein the electrode wiring is made of a metal, one end of the electrode wiring is connected with the graphene electrode, and the electrode wiring progresses according to an edge of the base substrate and is grouped to one side.

A display device according to another exemplary embodiment of the present invention includes: a display panel including an upper substrate and a lower substrate; an adhesive layer formed on the upper substrate; electrode wiring formed on the adhesive layer; and a graphene electrode formed on the electrode wiring, wherein the electrode wiring is made of a metal, one end of the electrode wiring is connected with the graphene electrode, and the electrode wiring progresses according to an edge of the base substrate and is grouped to one side.

As described above, in the manufacturing method of the touch panel according to an exemplary embodiment of the present invention, the metal layer used when forming the graphene electrode is not removed after forming the graphene, and the metal layer is patterned to be used as the electrode wiring such that the removal process of the metal layer and the forming process of the electrode wiring are unified into one. Accordingly, in the manufacturing process of the touch panel using the graphene as the transparent electrode, the manufacturing process is simplified.

DETAILED DESCRIPTION OF THE ILLUSTRATED EMBODIMENTS

Figure 1A:
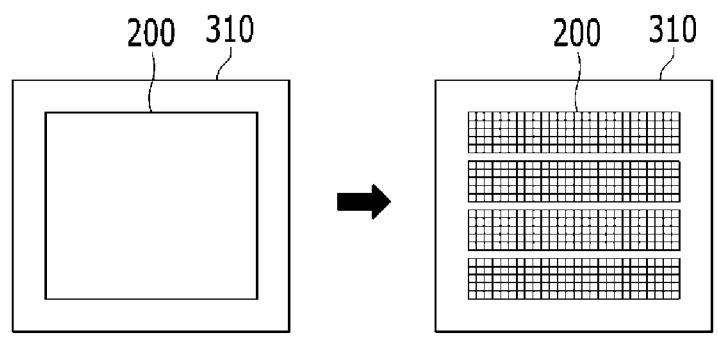
FIGS. 1A, 1B, 1C, 1D, and 1E are views sequentially showing a manufacturing process of a touch panel according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

A manufacturing method of a touch panel according to an exemplary embodiment of the present invention will be described with reference to accompanying drawings.

Firstly, a manufacturing method of a touch panel according to an exemplary embodiment of the present invention will be described with reference to FIGS. 1A to 1E and FIGS. 2A to 2E. FIGS. 1A to 1E are views sequentially showing a manufacturing process of a touch panel according to an exemplary embodiment of the present invention. FIG. 2A to FIG. 2E are cross-sectional views sequentially showing a manufacturing process of a touch panel according to an exemplary embodiment of the present invention.

Figure 2A:
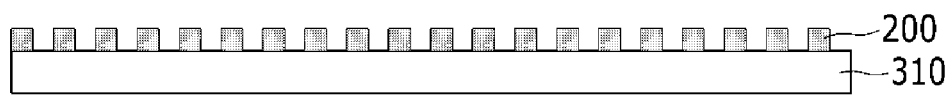
FIGS. 2A, 2B, 2C, 2D, and 2E are cross-sectional views sequentially showing a manufacturing process of a touch panel according to an exemplary embodiment of the present invention.

In an exemplary embodiment of the present invention, in a first step, a graphene electrode is formed on a metal substrate 310. FIGS. 1A and 2A show the first step.

Referring to FIG. 1A, graphene 200 is formed on a metal substrate 310. The formed graphene 200 may be patterned in a shape. In FIG. 1A, the graphene includes at least one graphene having a quadrangle grid-shape. However, the embodiments are not limited thereto. For example, the pattern of the graphene may have a grid shape such as quadrangular, circular, rectangular, and/or a honeycomb (hexagonal) shape. Also, the graphene may be formed as one structure without division.

Since the metal substrate 310 is later patterned to function as wiring for the touch panel, an appropriate material is selected. In detail, the metal substrate 310 may have various layered structures. For example, the metal substrate 310 may include a single layer of nickel (Ni), copper (Cu), aluminum (Al), gold (Au), silver (Ag), titanium (Ti), palladium (Pd), chromium (Cr), combinations thereof, a double layer of molybdenum (Mo)/silver (Ag), or a triple layer of silver (Ag)/palladium (Pd)/copper (Cu). However, these are examples and the material of the metal substrate is not limited thereto.

In the first step, graphene 200 is formed on the metal substrate 310. For example, the graphene 200 may be formed on the metal substrate 310 through a CVD (chemical vapor deposition) method, or oxidized graphene may be coated on the substrate 310 and may then be reduced into the graphene layer. However, the method of forming graphene 200 is not limited thereto and may include any method of graphene formation.

For example, the graphene 200 may be formed through the chemical vapor deposition (CVD) method. The chemical vapor deposition method is a method of synthesizing the graphene by using a transition metal that easily absorbs carbon as a catalytic layer at a high temperature. That is, a mixed gas is supplied to the substrate 310 formed with a metal layer including nickel (Ni) or copper (Cu) to be used as the catalytic layer, and the graphene 200 is formed from the surface of the metal layer. For example, if a mixed gas of methane and hydrogen is supplied into a reaction chamber at a high temperature of about 800° C. to 1000° C., carbon atoms are absorbed on the metal substrate of the catalytic layer, thereby generating the graphene.

In the first step, the graphene 200 may be patterned to function as an electrode element of the touch sensor. The patterning of the graphene may use a photolithography technique, but is not limited thereto.

Additionally or alternatively, the patterning of the graphene may be performed by using a transfer sacrificial layer. The transfer sacrificial layer includes a polymer material having reactivity to a light source. For example, the transfer sacrificial layer may include PMMA (polymethylmethacrylate) having reactivity to an electron beam. After the transfer sacrificial layer is patterned by using electron beam lithography, the underlying graphene layer is etched using the patterned transfer sacrificial layer as an etching mask through oxygen plasma etching, thereby obtaining the patterned graphene layer.

The patterning method described above is only one example, and the patterning of the graphene electrode is not limited thereto. The graphene may not be patterned, and the graphene single layer may be used as the electrode structure.

Figure 1B:
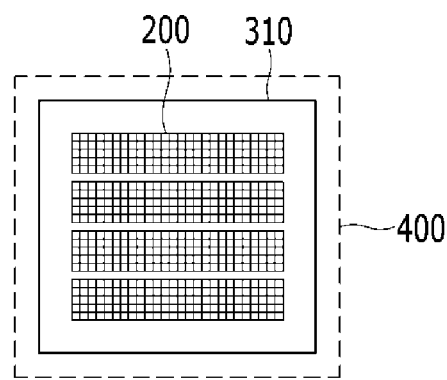
Figure 2B:
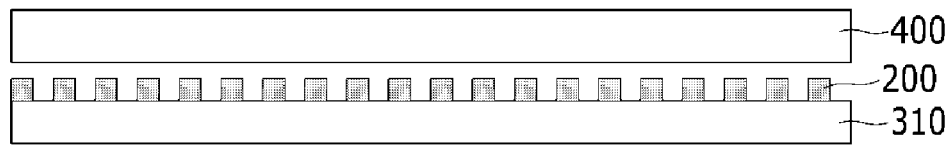

In an exemplary embodiment of the present invention, in a second step, a transfer film 400 is adhered to the graphene 200. FIG. 1B and FIG. 2B show the graphene to which the transfer film is adhered.

The transfer film 400 may include various materials such as polydimethylsiloxane, polyethylene terephthalate (PET), a polyimide film, a polyurethane film, and/or glass. The transfer film 400 may be a thermal stripping film of which adherence is lost at a certain temperature.

The transfer film 400 is positioned on the graphene 200 and pressure is applied to adhere the graphene 200 to the transfer film 400. If the transfer film is heated, the flexibility between the transfer film 400 and the graphene 200 is increased, and adherence may still exist even if there are protrusions, depressions, patterns, and/or other deformities at the surface of the graphene 200. However, the heating temperature may not be greater than the temperature at which the transfer film 400 loses the adherence.

Typically, a transfer film is used to transfer pre-formed graphene onto another material. However in an exemplary embodiment of the present invention, the final location of the graphene 200 is on the material on which the graphene 200 is initially formed, so transfer of the graphene is not needed. Accordingly, in an exemplary embodiment of the present invention, the transfer film 400 performs the same function as the substrate by temporarily adhering the graphene 200 in the manufacturing process of the touch panel instead of transferring the graphene onto the other material.

Figure 1C:
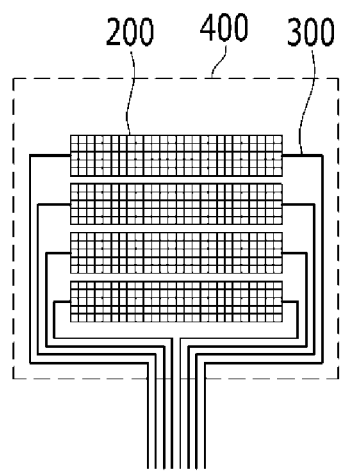
Figure 2C:
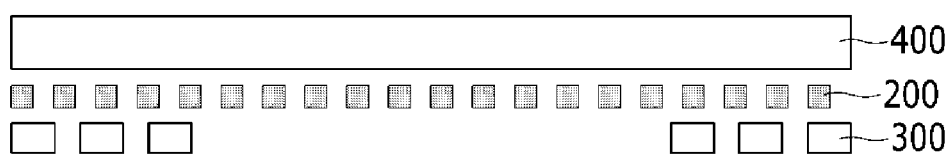

In an exemplary embodiment of the present invention, in a third step, the metal substrate 310 is patterned to form electrode wiring 300. FIGS. 1C and 2C show the touch panel in which the metal substrate is patterned to form the electrode wiring.

In the capacitive type of touch panel, the upper substrate formed with the first transparent electrode and the lower substrate formed with the second transparent electrode are spaced apart from each other with an insulating therebetween. In this manner, the first transparent electrode and the second transparent electrode do not contact each other. As described above, in the touch panel according to an exemplary embodiment of the present invention, the first transparent electrode and the second transparent electrode are graphene electrodes. Hereinafter, the first transparent electrode and the second transparent electrode are collectively called graphene electrodes.

Also, in a capacitive type of touch panel, the upper substrate and the lower substrate include the electrode wiring connected to the transparent electrode. The electrode wiring performs the function of transmitting a change of capacitance generated in the first transparent electrode and the second transparent electrode to the controller when the input means contacts the touch screen.

Accordingly, the electrode wiring 300 may include a material having high electrical conductivity, such as a metal. Further, since the metal catalytic layer used in the formation process of the graphene may be a metal, in an exemplary embodiment of the present invention, the metal layer used in the forming process of the graphene is not removed after forming the graphene and is used as the electrode wiring through the patterning. Accordingly, after forming the graphene, the removal process of the metal catalytic layer and the formation process of the metal layer for the metal wiring electrode are simplified into one process.

Therefore, according to exemplary embodiments of the present invention, the metal catalytic layer used when forming the graphene and the material of the electrode wiring may be the same. That is, the electrode wiring 300 is formed by patterning the metal substrate 310 such that the electrode wiring 300 may also include the single layer of nickel (Ni), copper (Cu), aluminum (Al), gold (Au), silver (Ag), titanium (Ti), palladium (Pd), chromium (Cr), or combinations thereof, a double layer of molybdenum (Mo)/silver (Ag), or a triple layer of silver (Ag)/palladium (Pd)/copper (Cu).

When the metal substrate 310 is patterned into the electrode wiring 300, the metal substrate may be patterned into the electrode wiring by using etching of a dry or wet type. The etching method and a composition of an etchant may be changed according to a kind of the metal. However, this is merely an example, and any method of metal patterning may be used.

The metal substrate 310 is patterned with a shape of the electrode wiring 300 of the touch panel. That is, the electrode wiring 300 is connected to one side or both sides of the graphene electrode. One end of the electrode wiring is connected to the graphene electrode, and the other end is connected to the controller. The metal substrate 310 disposed under the graphene 200 is patterned to form the electrode wiring 300 such that the electrode wiring 300 contacts the graphene from below the graphene.

Referring to FIG. 1C, the electrode wiring 300 is connected to each graphene electrode 200, continues in a direction parallel to the edge of the panel, and is grouped into one side where the controller is positioned.

Figure 1D:
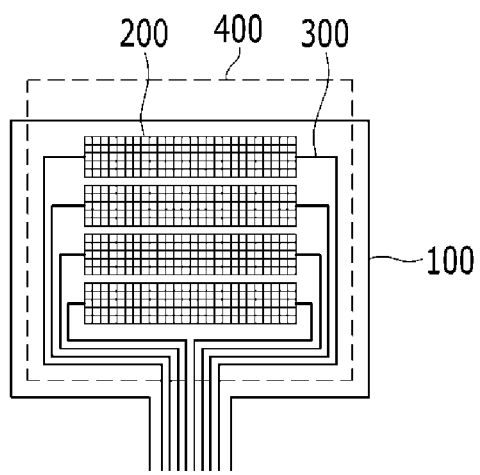
Figure 2D:
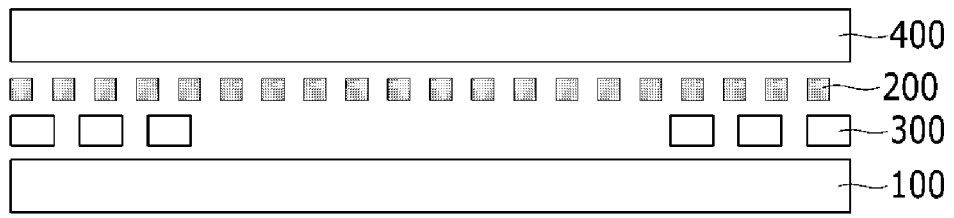

In an exemplary embodiment of the present invention, in a fourth step, a base substrate 100 is adhered below the electrode wiring. FIGS. 1D and 2D show the touch panel adhered to the base substrate 100.

The base substrate 100 may include at least one of polyethylene terephthalate (PET), polycarbonate (PC), polymethylmethacrylate (PMMA), polyethylene naphthalate (PEN), polyether sulfonate (PES), a cyclic olefin polymer (COC), a triacetyl cellulose (TAC) film, a polyvinyl alcohol (PVA) film, a polyimide (PI) film, polystyrene (PS), biaxially oriented polystyrene (BOPS) including K resin, glass, and tempered glass, but it is not limited thereto.

The base substrate 100 may be an upper substrate of the display panel. That is, the graphene 200 may be adhered to the upper substrate of the display panel without an additional base substrate. The display panel may be a liquid crystal display (LCD) panel, an electrophoretic display panel (EDP), an organic light emitting diode (OLED) panel, or a plasma display panel (PDP), and the kind of the upper substrate may be changed according to the panel. At this time, the upper substrate of each panel becomes the base substrate 100 according to an exemplary embodiment of the present invention.

Next, an additional adhering process may be used to adhere the electrode wiring 300 and the base substrate 100 to each other.

The electrode wiring 300 and the base substrate 100 may be adhered by using a photo-hardening resin. That is, at least one of a polyester-based, epoxy-based, urethane-based, polyether-based, polyacryl-based, acryl-based, and siloxane-based resin may be coated on adhesion surfaces of the electrode wiring and the base substrate, and UV rays may be radiated to adhere them to each other.

However, the adhesion method of the electrode wiring 300 and the base substrate 100 is not limited to the adhesion using the photo-hardening resin, and any method of adhering the electrode wiring 300 and the base substrate 100 may be used without limitation.

Figure 1E:
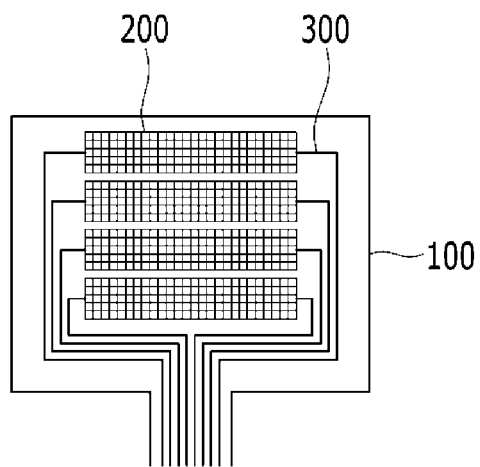
Figure 2E:
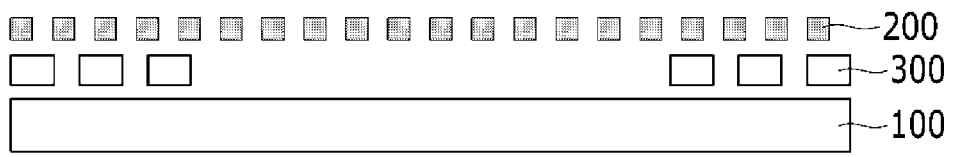

In an exemplary embodiment of the present invention, in a fifth step, the transfer film 400 on the graphene layer is removed. FIGS. 1E and 2E show the touch panel of which the transfer film is removed.

The transfer film 400 may include at least one of various materials such as polydimethylsiloxane, polyethylene terephthalate (PET), a polyimide film, a polyurethane film, and glass, but is not limited thereto. Also, the transfer film 400 may be a thermal separation film that loses adherence at a certain temperature.

When the transfer film 400 is the thermal separation film that loses adherence at a certain temperature, the fifth step may be performed through a method of heating the touch panel adhered to the transfer film 400 to more than the temperature at which the transfer film loses adhesion properties. Thus, when using the thermal separation film as the transfer film 400 and the transfer film 400 is heated, the adherence of the transfer film is eliminated such that the transfer film may be easily separated from the graphene 200.

As described above, the manufacturing method of the touch panel according to an exemplary embodiment of the present invention does not remove the metal substrate used when forming the graphene but uses it as the wiring of the touch panel through the patterning, thereby simplifying the manufacturing process of the touch panel.

A manufacturing process of a touch panel according to a comparative example to the present invention is shown in FIGS. 5A to 5G.

Referring to FIGS. 5A to 5G, in the manufacturing process of the touch panel according to the comparative example to the present invention, the step of removing the metal catalytic layer 310 used when forming the graphene and the step of forming the metal layer 320 to form the metal electrode wiring for the touch panel are separated such that there are a total of seven steps in the comparative example.

That is, the manufacturing method of the touch panel according to the comparative example of the present invention includes a step (step A, FIG. 5A) of forming the graphene 200 on the metal substrate 310, a step (step B, FIG. 5B) of adhering the transfer film 400 on the graphene, a step (step C, FIG. 5C) of removing the metal substrate 310, a step (step D, FIG. 5D) of transferring the graphene 200 to the base substrate 100, a step (step E, FIG. 5E) of removing the transfer film 400, a step (step F, FIG. 5F) of forming a metal layer 320 on the graphene 200, and a step (step G, FIG. 5G) of patterning the metal layer 320 to form the electrode wiring 300.

This method separately includes the step (step C) of removing the metal substrate 310 and the step (step F) of forming the metal layer 320 on the graphene such that the manufacturing process is more complicated than that according exemplary embodiments of the present invention.

However, the manufacturing method of the touch panel according exemplary embodiments of the present invention does not remove the metal substrate used as the catalytic layer when forming the graphene, and instead uses it as the wiring of the touch panel through the patterning, thereby simplifying the manufacturing process of the touch panel.

Figure 3A:
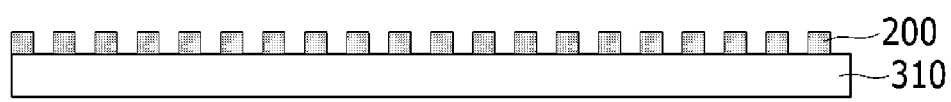
FIGS. 3A, 3B and 3C are cross-sectional views sequentially showing a manufacturing process of a touch panel according to another exemplary embodiment of the present invention.
Figure 3B:
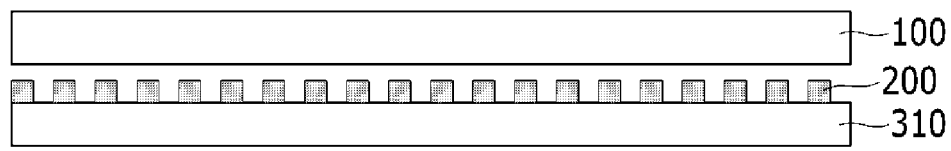
Figure 3C:
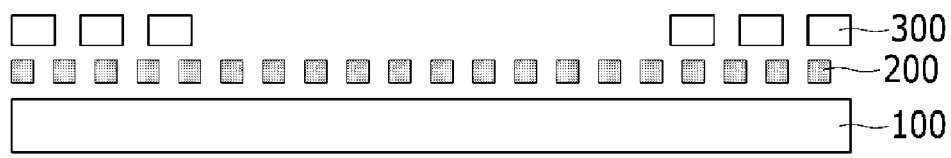
Figure 4A:
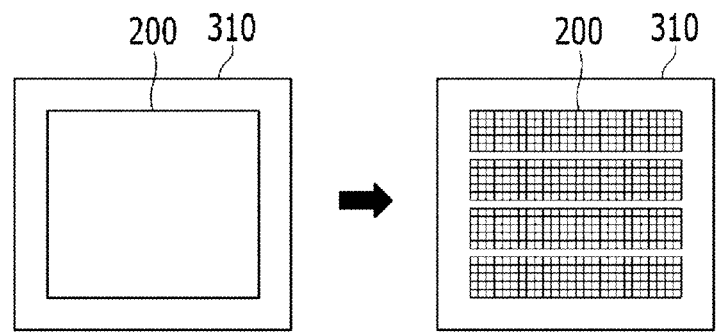
FIGS. 4A, 4B, and 4C are views sequentially showing a manufacturing process of a touch panel according to another exemplary embodiment of the present invention.
Figure 4B:
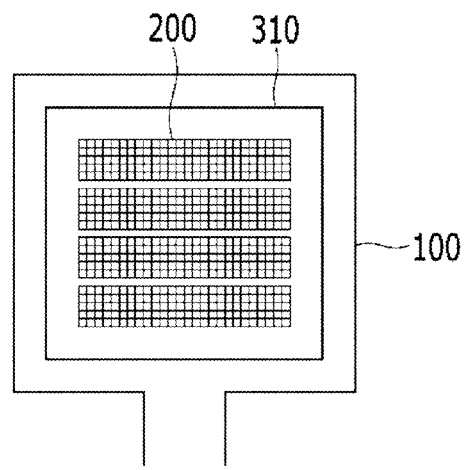
Figure 4C:
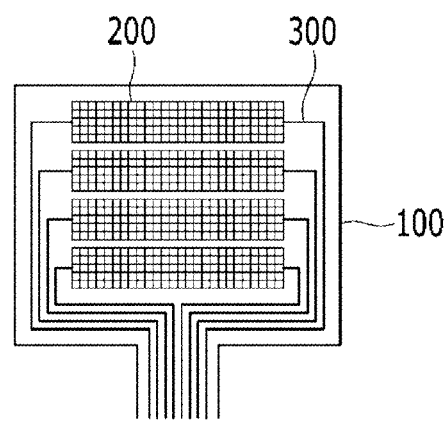
Figure 5A:
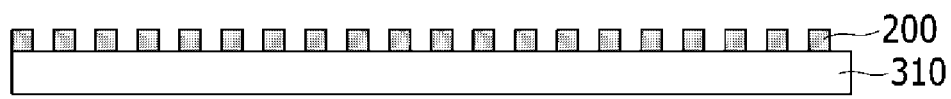
FIGS. 5A, 5B, 5C, 5D, 5E, 5F, and 5G are cross-sectional views sequentially showing a manufacturing process of a touch panel according to a comparative example.
Figure 5B:
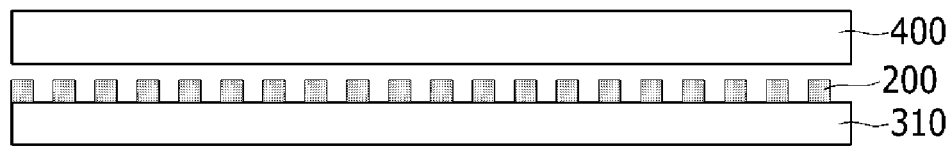
Figure 5C:
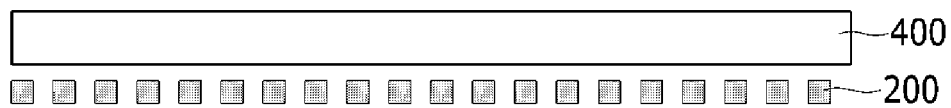
Figure 5D:
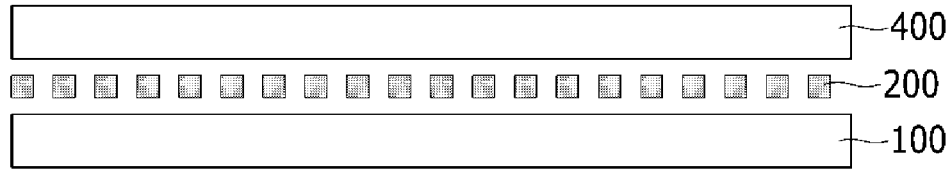
Figure 5E:
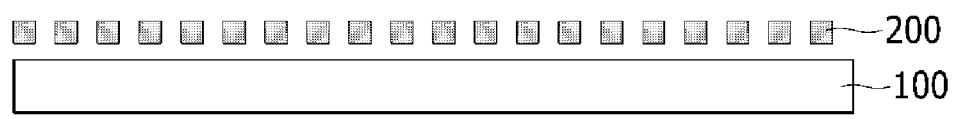
Figure 5F:
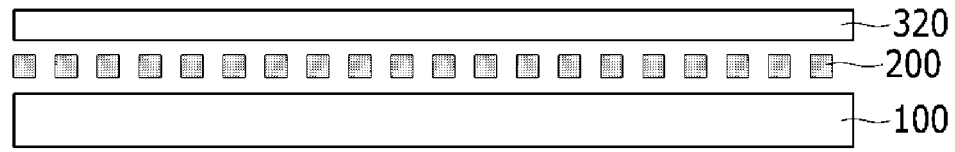
Figure 5G:
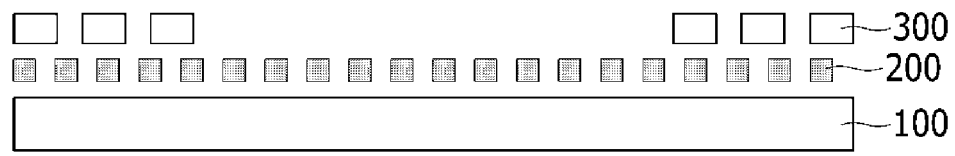

Next, a manufacturing method of a touch panel according to another exemplary embodiment of the present invention will be described with reference to FIGS. 3A to 3C and FIGS. 4A to 4C. FIGS. 3A to 3C are cross-sectional views sequentially showing a manufacturing process of a touch panel according to the current exemplary embodiment of the present invention. FIGS. 4A to 4C are views sequentially showing a manufacturing process of a touch panel according to the current exemplary embodiment of the present invention.

In an exemplary embodiment of the present invention, in the first step, the graphene 200 and the transparent electrode are formed on the metal substrate 310. FIGS. 3A and 4A show the first step.

Referring to FIG. 4A, the graphene 200 is formed on the metal substrate 310. The formed graphene 200 may be patterned in a shape. In FIG. 4A, a plurality of graphene shapes of the quadrangle grid-shape are formed, however the embodiments are not limited thereto. For example, the pattern of the graphene may be the grid shape of various shapes such as the quadrangular, circular, rectangular, and honey comb (hexagonal) type. Further, the graphene may be formed as one structure without division.

Since the metal substrate 310 is later patterned to function as wiring for the touch panel, an appropriate material is selected. In detail, the metal substrate 310 may include the single layer of nickel (Ni), copper (Cu), aluminum (Al), gold (Au), silver (Ag), titanium (Ti), palladium (Pd), chromium (Cr), combinations thereof, the double layer of molybdenum (Mo)/silver (Ag), or the triple layer of silver (Ag)/palladium (Pd)/copper (Cu). However, these are examples, and the material of the metal substrate is not limited thereto.

In the first step, graphene 200 is formed on the metal substrate 310. For example, the graphene 200 may be formed on the metal substrate 310 through the CVD (chemical vapor deposition) method, or an oxidized graphene may be coated on the substrate 310 and may then be reduced into the graphene layer. However, the method of forming graphene 200 is not limited thereto and may include any method of graphene formation.

For example, the graphene 200 may be formed through the chemical vapor deposition (CVD) method. The chemical vapor deposition method is a method of synthesizing the graphene by using the transition metal that easily absorbs carbon as the catalytic layer at a high temperature. That is, the mixed gas is supplied to the substrate 310 formed with the metal layer including nickel (Ni) or copper (Cu) to be used as the catalytic layer, and the graphene 200 is formed from the surface of the metal layer. For example, if the mixed gas of methane and hydrogen is supplied into a reaction chamber at a high temperature of about 800° C. to 1000° C., carbon atoms are absorbed on the metal substrate of the catalytic layer, thereby generating the graphene.

In the first step, the graphene 200 may be patterned to function as an electrode element of the touch sensor. The patterning of the graphene may use a photolithography technique, but is not limited thereto.

Additionally or alternatively, the patterning of the graphene may be performed by using the transfer sacrificial layer. The transfer sacrificial layer includes a polymer material having reactivity to a light source. For example, the transfer sacrificial layer may include PMMA (polymethylmethacrylate) having reactivity to an electron beam. The transfer sacrificial layer is patterned by using electron beam lithography. The underlying graphene layer is etched using the patterned transfer sacrificial layer as an etching mask through oxygen plasma etching, thereby obtaining the patterned graphene layer.

The patterning method described above is only one example, and the patterning of the graphene electrode is not limited to thereto. The graphene may not be patterned and the graphene single layer may be used as the electrode structure.

In an exemplary embodiment of the present invention, in the second step, the base substrate 100 is adhered to the graphene electrode. FIGS. 3B and 4B show the touch panel on which the base substrate 100 is adhered.

The base substrate 100 may include polyethylene terephthalate (PET), polycarbonate (PC), polymethylmethacrylate (PMMA), polyethylene naphthalate (PEN), polyether sulfonate (PES), a cyclic olefin polymer (COC), a triacetyl cellulose (TAC) film, a polyvinyl alcohol (PVA) film, a polyimide (PI) film, polystyrene (PS), biaxially oriented polystyrene (BOPS) including K resin, glass, and/or tempered glass, but it is not limited thereto.

The base substrate 100 may be an upper substrate of the display panel. That is, the graphene 200 may be adhered to the upper substrate of the display panel without the additional base substrate. The display panel may be a liquid crystal display panel (LCD) panel, an electrophoretic display panel (EDP), an organic light emitting diode (OLED) panel, or a plasma display panel (PDP), and a kind of the upper substrate may be changed according to the panel. At this time, the upper substrate of each panel becomes the base substrate 100 according to an exemplary embodiment of the present invention.

In the second step, an additional adhesion process adheres the graphene electrode 200 and the base substrate 100 to each other.

The graphene electrode 200 and the base substrate 100 may be adhered by using a photo-hardening resin. That is, at least one of a polyester-based, epoxy-based, urethane-based, polyether-based, polyacryl-based, acryl-based, and siloxane-based resin may be coated on adhesion surfaces of the graphene electrode and the base substrate, and UV rays may be radiated to adhere them to each other.

The adhesion method of the graphene electrode 200 and the base substrate 100 is not limited to the adhesion using the photo-hardening, and any method of adhering the graphene electrode 200 and the base substrate 100 may be used without limitation.

In an exemplary embodiment of the present invention, in the third step, the metal substrate 310 is patterned to form the electrode wiring 300. FIGS. 3C and 4C show the touch panel in which the metal substrate 310 is patterned to form the electrode wiring 300.

In an exemplary embodiment of the present invention, the metal substrate 310 used in the formation process of the graphene is not removed after forming the graphene, but is used as the electrode wiring 300 after patterning. Accordingly, the metal substrate 310 used when forming the graphene and the electrode wiring 300 are the same material. That is, the electrode wiring 300 is formed by patterning the metal substrate 310 such that the electrode wiring 300 may include the single layer of nickel (Ni), copper (Cu), aluminum (Al), gold (Au), silver (Ag), titanium (Ti), palladium (Pd), chromium (Cr), or combinations thereof, the double layer of molybdenum (Mo)/silver (Ag), and/or the triple layer of silver (Ag)/palladium (Pd)/copper (Cu).

When the metal substrate 310 is patterned into the electrode wiring 300, the metal substrate may be patterned into the electrode wiring by using etching of a dry or wet type. The etching method and a composition of the etchant may be changed according to a kind of the metal. However, this is merely an example, and any method of metal patterning may be used.

The metal substrate 310 is patterned with the general shape of the electrode wiring 300. That is, the electrode wiring 300 may be connected to one side or both sides of the graphene electrode. One end of the electrode wiring is connected to the graphene electrode, and the other end is connected to the controller. In an exemplary embodiment of the present invention, the metal substrate 310 on the graphene electrode is patterned to form the electrode wiring 300 such that the electrode wiring 300 and the graphene 200 contact each other on the graphene 200.

Referring to FIG. 4C, the electrode wiring 300 is respectively connected to each graphene electrode 200, continues in a direction parallel to the edge of the panel, and is grouped into one side where the controller is positioned.

As described above, the manufacturing method of the touch panel according to an exemplary embodiment of the present invention does not remove the metal layer when forming the graphene, but is instead patterned to be the electrode wiring, thereby simplifying the manufacturing process. Also, the graphene formed on the metal catalytic layer is not transferred onto the different material such that the adhering process and the removing process of the transfer film are omitted, thereby simplifying the manufacturing process.

Figure 6A:
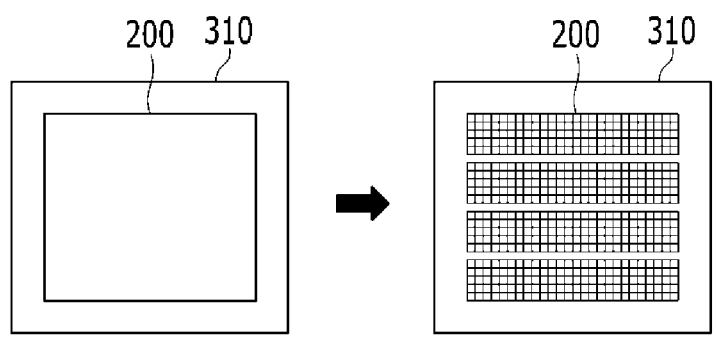
FIG. 6A is a top view of a touch panel according to an exemplary embodiment of the present invention.
Figure 6B:
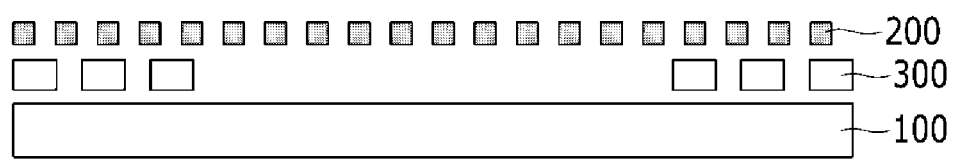
FIG. 6B is a cross-sectional view of a touch panel according to an exemplary embodiment of the present invention.

Next, the touch panel according to an exemplary embodiment of the present invention will be described. FIG. 6A and FIG. 6B are views of a touch panel according to an exemplary embodiment of the present invention.

Referring to FIG. 6A and FIG. 6B, the electrode wiring 300 is disposed on the base substrate 100.

The base substrate 100 may be formed of polyethylene terephthalate (PET), polycarbonate (PC), polymethylmethacrylate (PMMA), polyethylene naphthalate (PEN), polyether sulfonate (PES), a cyclic olefin polymer (COC), a triacetyl cellulose (TAC) film, a polyvinyl alcohol (PVA) film, a polyimide (PI) film, polystyrene (PS), biaxially oriented polystyrene (BOPS) including K resin, glass, and/or tempered glass, but it is not limited thereto.

Also, the base substrate 100 may be an upper substrate of the display panel. That is, the graphene 200 may be adhered to the upper substrate of the display panel without an additional base substrate. The display panel may be a liquid crystal display (LCD) panel, an electrophoretic display panel (EDP), an organic light emitting diode (OLED) panel, and a plasma display panel (PDP), and a kind of the upper substrate may be changed according to the panel. At this time, the upper substrate of each panel becomes the base substrate 100 according to an exemplary embodiment of the present invention.

The electrode wiring 300 may be formed by patterning the metal substrate 310 such that the electrode wiring 300 may include a single layer of nickel (Ni), copper (Cu), aluminum (Al), gold (Au), silver (Ag), titanium (Ti), palladium (Pd), chromium (Cr), or combinations thereof, the double layer of molybdenum (Mo)/silver (Ag), or the triple layer of silver (Ag)/palladium (Pd)/copper (Cu). One end of the electrode wiring 300 is connected to the graphene electrode 200 at the bottom surface of the graphene electrode 200, and the other end thereof is connected to the controller.

Referring to FIG. 6B, the electrode wiring 300 is connected to graphene 200, continues in a direction parallel to the edge of the panel, and is grouped into one side where the controller is disposed. The electrode wiring 300 is connected to a lower portion of the graphene electrode 200.

An adhesive layer (not shown) is disposed between the base substrate 100 and the electrode wiring 300 to adhere the base substrate 100 and the electrode wiring 300 together. The adhesive layer may include at least one resin selected from a group including a polyester-based resin, an epoxy-based resin, a urethane-based resin, a polyether-based resin, a polyacryl-based resin, an acryl-based resin, a siloxane-based resin, and combinations thereof.

The graphene electrode 200 is positioned on the electrode wiring 300. The graphene electrode 200 may be patterned in various shapes. In FIG. 6B, the graphene having a quadrangle grid-shape is disposed in plural. However, the embodiments are not limited thereto. For example, the pattern of the graphene may have a grid-shape such as quadrangular, circular, rectangular, and/or a honeycomb (hexagonal) types. Also, the graphene may be formed of one structure without division. Alternatively, the graphene may not be patterned, and the graphene single layer of the mesh structure may be used as the electrode structure.

Figure 7A:
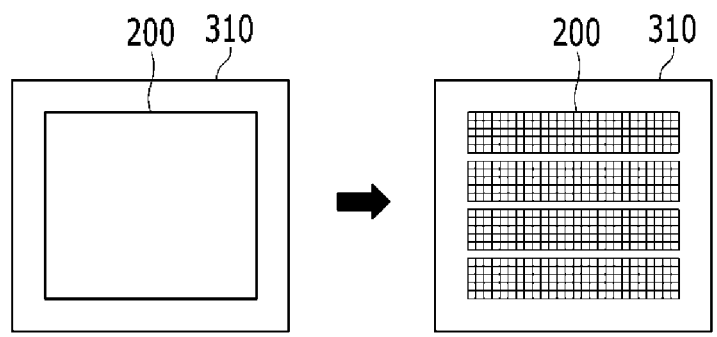
FIG. 7A is a top view of a touch panel according to another exemplary embodiment of the present invention.
Figure 7B:
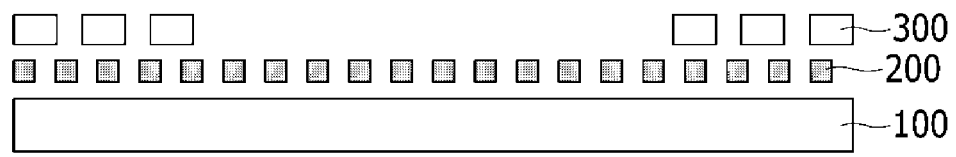
FIG. 7B is a cross-sectional view of a touch panel according to an exemplary embodiment of the present invention.

Next, a touch panel according to another exemplary embodiment of the present invention will be described. FIG. 7A and FIG. 7B are views of a touch panel according to another exemplary embodiment of the present invention.

Referring to FIG. 7A and FIG. 7B, the graphene electrode 200 is disposed on the base substrate 100.

The base substrate may be formed of polyethylene terephthalate (PET), polycarbonate (PC), polymethylmethacrylate (PMMA), polyethylene naphthalate (PEN), polyether sulfonate (PES), a cyclic olefin polymer (COC), a triacetyl cellulose (TAC) film, a polyvinyl alcohol (PVA) film, a polyimide (PI) film, polystyrene (PS), biaxially oriented polystyrene (BOPS) including K resin, glass, and/or tempered glass, but it is not limited thereto.

The graphene electrode 200 is disposed on the base substrate. The graphene electrode 200 may be patterned with the various shapes. In FIG. 7B, the graphene having a quadrangle grid-shape is disposed in plural. However, the embodiments are not limited thereto. For example, the pattern of the graphene may be a grid shape such as quadrangular, circular, rectangular, and/or honeycomb (hexagonal) types. Also, the graphene may be formed of one structure without division. Alternatively, the graphene may not be patterned, and the graphene single layer of the mesh structure may be used as the electrode structure as it is.

The adhesive layer (not shown) may be disposed between the base substrate 100 and the graphene electrode 200 to adhere the base substrate 100 and the graphene electrode 200 together. The adhesive layer may include at least one resin selected from a group including a polyester-based resin, an epoxy-based resin, a urethane-based resin, a polyether-based resin, a polyacryl-based resin, an acryl-based resin, a siloxane-based resin, and combinations thereof.

The electrode wiring 300 is disposed on the graphene electrode 200. The electrode wiring 300 may be formed by patterning the metal substrate 310 such that the electrode wiring 300 may also include the single layer of nickel (Ni), copper (Cu), aluminum (Al), gold (Au), silver (Ag), titanium (Ti), palladium (Pd), chromium (Cr), combinations thereof, the double layer of molybdenum (Mo)/silver (Ag), or the triple layer of silver (Ag)/palladium (Pd)/copper (Cu). One end of the electrode wiring 300 is connected to the graphene electrode 200 at the top surface of the graphene electrode 200, and the other end is connected to the controller. The electrode wiring 300 and the graphene 200 contact each other at the top surface of the graphene 200.

Referring to FIG. 7B, the electrode wiring 300 is connected to each graphene 200, continues in a direction parallel to the edge of the panel, and is grouped into one side where the controller is positioned.

Figure 8:
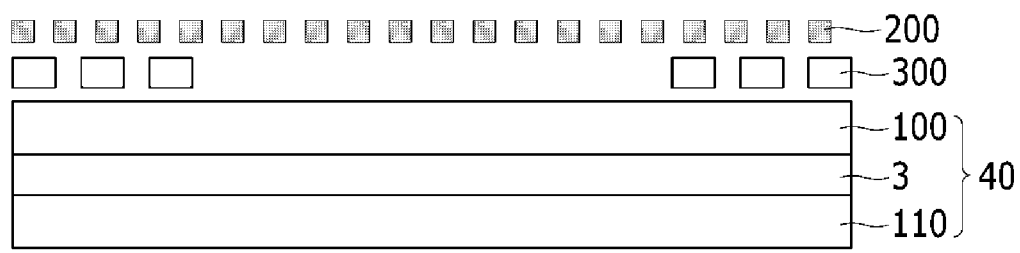
FIG. 8 is a view of a liquid crystal display applied with a touch panel according to an exemplary embodiment of the present invention.
Figure 9:
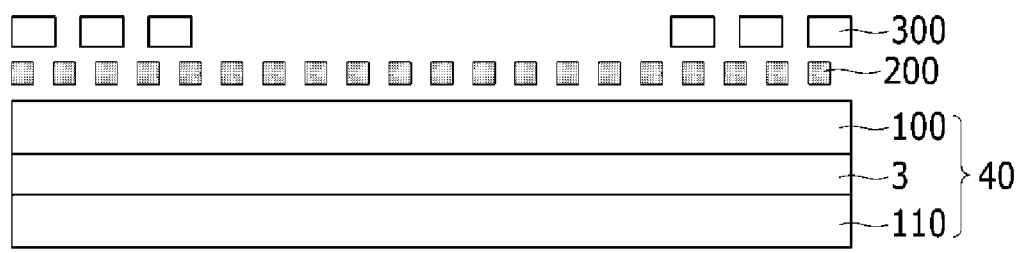
FIG. 9 is a view of a liquid crystal display applied with a touch panel according to another exemplary embodiment of the present invention.
Figure 10:
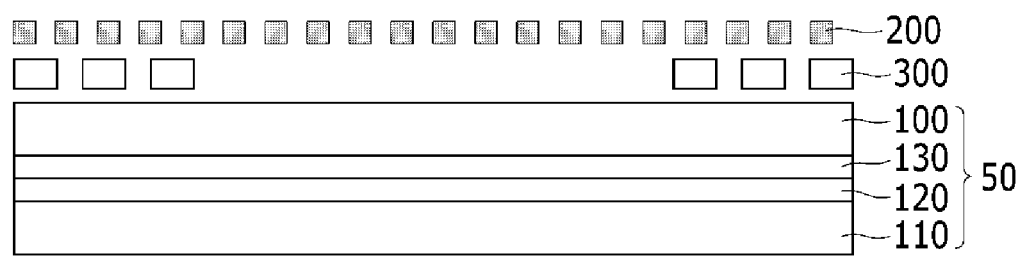
FIG. 10 is a view of an organic light emitting diode display applied with a touch panel according to an exemplary embodiment of the present invention.
Figure 11:
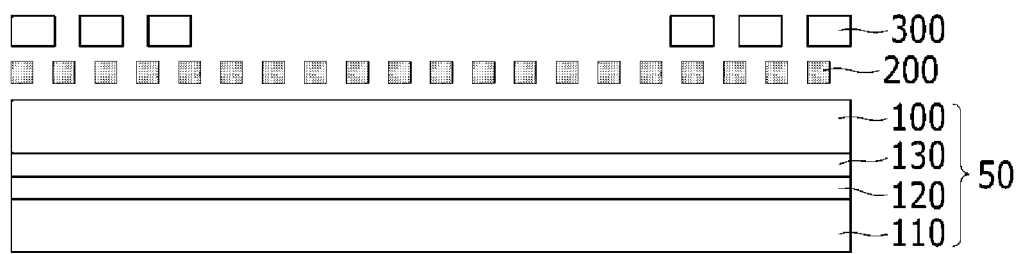
FIG. 11 is a view of an organic light emitting diode display applied with a touch panel according to another exemplary embodiment of the present invention.

Next, a display device including a touch panel according to an exemplary embodiment of the present invention will be described with reference to FIG. 8 to FIG. 11. FIG. 8 and FIG. 9 are views of a liquid crystal display including a touch panel according to an exemplary embodiment of the present invention. FIG. 10 and FIG. 11 are views of an organic light emitting diode display including a touch panel according to an exemplary embodiment of the present invention.

As described above, the touch panel according to an exemplary embodiment of the present invention may adhere the graphene to the upper substrate of the display panel by using the upper substrate of the display panel as the base substrate.

The display panel may be a liquid crystal display (LCD) panel, an electrophoretic display panel (EDP), an organic light emitting diode (OLED) panel, or a plasma display panel (PDP). The kind of the upper substrate may be changed according to the panel.

FIG. 8 and FIG. 9 are views of the liquid crystal display including the touch panel according to an exemplary embodiment of the present invention. The description of FIG. 8 and FIG. 9 is the same as described above. The detailed description for similar constituent elements is omitted.

Referring to FIG. 8, a liquid crystal panel 40 including a lower substrate 110, an upper substrate 100, and a liquid crystal layer 3 interposed between the two substrates. The lower substrate 110 includes a plurality of pixel areas. A gate line (not shown) extending in a first direction, a data line (not shown) extending in a second direction intersecting the first direction and insulated from the gate line, and a pixel electrode (not shown) may be formed in each pixel area. Also, a thin film transistor (not shown) electrically connected to the gate line and the data line and electrically connected to the corresponding pixel electrode may be provided in each pixel. The thin film transistor may provide a driving signal to a side of the corresponding pixel electrode. A driver IC (not shown) may be formed at one side of the first substrate. The driver IC may receive various signals from the outside, and may output the driving signal driving the display panel 40 to a side of the thin film transistor in response to the various input control signals.

The upper substrate 100 may include RGB color filters generating predetermined colors by using light provided from a backlight unit (not shown) on one surface, and a common electrode (not shown) formed on the RGB color filters and facing the pixel electrode. The RGB color filters may be formed through a thin film process. The color filters are formed at the upper substrate in an exemplary embodiment of the present invention, but it is not limited thereto. For example, the color filters may be formed on the lower substrate. Further, the common electrode of the upper substrate may be formed at the lower substrate.

The liquid crystal layer 3 is arranged with a predetermined orientation by the voltage applied to the pixel electrode and the common electrode such that transmittance of the light provided from the backlight unit is changed, thereby displaying the image through the display panel 40. In the case that the backlight unit does not exist, the transmittance of the light incident to the front surface of the display panel and reflected is controlled, thereby displaying the images.

The electrode wiring 300 is disposed on the upper substrate 100 of the liquid crystal panel 40. In the present exemplary embodiment, the upper substrate 100 becomes the base substrate. An adhesive layer (not shown) may be disposed between the base substrate 100 and the electrode wiring 300 to adhere the base substrate 100 and the electrode wiring 300. The graphene electrode 200 is positioned on the electrode wiring 300. The detailed description of the base substrate 100, the graphene electrode 200, the adhesive layer, and the electrode wiring 300 is the same as that described above.

Referring to FIG. 9, the graphene electrode 200 is disposed on the upper substrate 100 of the liquid crystal panel 40. In the present exemplary embodiment, the upper substrate 100 is the base substrate. An adhesive layer (not shown) may be disposed between the base substrate 100 and the graphene electrode 200 to adhere the base substrate 100 and the graphene electrode 200 to each other. The electrode wiring 300 is disposed on the graphene electrode 200. The detailed description of the liquid crystal panel 40, the base substrate 100, the graphene electrode 200, the adhesive layer, and the electrode wiring 300 is the same as described above.

In FIG. 8 and FIG. 9, the liquid crystal panel 40 is simply shown, and in the present invention, the liquid crystal panel 40 of various structures may be used.

FIG. 10 and FIG. 11 are views of an organic light emitting diode display including a touch panel according to an exemplary embodiment of the present invention. The description of the touch panel of FIG. 10 and FIG. 11 is the same as described above. The detailed description for similar constituent elements is omitted.

Referring to FIG. 10, an organic light emitting panel 50 including the lower substrate 110, a semiconductor layer 120, an organic emission layer 130, and the upper substrate 100 is provided. The semiconductor layer 120 may include a polysilicon or oxide semiconductor, and the semiconductor layer 120 may include a gate insulating layer, a gate line, a data line, and a pixel electrode formed on a semiconductor. The semiconductor layer 120 may include the thin film transistor, and may include a driving transistor supplying a current to the organic emission layer 130. The organic emission layer 130 may include a plurality of layers including one or more of an emission layer, a hole-injection layer (HIL), a hole transport layer (HTL), an electron transport layer (ETL), and an electron injection layer (EIL). If the organic emission layer 130 includes all of them, the hole injection layer (HIL) may be placed on a pixel electrode, that is, an anode, and the hole transport layer (HTL), the emission layer, the electron transport layer (ETL), and the electron injection layer (EIL) may be sequentially stacked over the hole injection layer (HIL). The emission layer may be made of an organic material emitting one light among primary colors such as three primary colors of red, green, and blue.

The electrode wiring 300 is disposed on the upper substrate 100 of the organic light emitting panel 50. In the present exemplary embodiment, the upper substrate 100 is the base substrate. An adhesive layer (not shown) may be disposed between the base substrate 100 and the electrode wiring 300 to adhere the base substrate 100 and the electrode wiring 300 to each other. The graphene electrode 200 is disposed on the electrode wiring 300. The detailed description of the base substrate 100, the graphene electrode 200, the adhesive layer, and the electrode wiring 300 is the same as described above.

Referring to FIG. 11, the graphene electrode 200 is disposed on the upper substrate 100 of the organic light emitting panel 50. In the present exemplary embodiment, the upper substrate 100 is the base substrate. An adhesive layer (not shown) is disposed between the base substrate 100 and the graphene electrode 200 to adhere the base substrate 100 and the graphene electrode 200. The electrode wiring 300 is disposed on the graphene electrode 200. The detailed description of the organic light emitting panel 50, the base substrate 100, the graphene electrode 200, the adhesive layer, and the electrode wiring 300 is the same as described above.

In FIG. 10 and FIG. 11, the organic light emitting panel 50 is simply shown, but in an exemplary embodiment of the present invention, the organic light emitting panel 50 of various structures may be used.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a touch panel, comprising:
   forming a graphene electrode on a metal substrate;
   adhering a transfer film onto a surface of the graphene electrode opposite the metal substrate;
   patterning the metal substrate, after adhering the transfer film, into electrode wiring;
   adhering a base substrate under the electrode wiring; and
   removing the transfer film,
   wherein forming the graphene electrode further comprises patterning a graphene layer.

2. The method of claim 1, wherein the metal substrate comprises a single layer of copper (Cu), aluminum (Al), gold (Au), silver (Ag), titanium (Ti), palladium (Pd), chromium (Cr), or any combinations thereof, a double layer of molybdenum (Mo)/silver (Ag), or a triple layer of silver (Ag)/palladium (Pd)/copper (Cu).

3. The method of claim 1, wherein forming the graphene electrode comprises chemical vapor deposition using the metal substrate as a catalyst.

4. The method of claim 1, wherein the transfer film comprises at least one material selected from the group consisting of polydimethylsiloxane, polyethylene terephthalate (PET), a polyimide film, a polyurethane film, and glass.

5. The method of claim 1, wherein the transfer film comprises a thermal separation film in which adherence properties are lost at a certain temperature.

6. The method of claim 5, wherein removing the transfer film comprises heating the transfer film to a temperature greater than or equal to the certain temperature.

7. The method of claim 1, wherein the electrode wiring comprises a first end electrically connected to the graphene electrode, a wiring section extending parallel to an edge of the touch panel, and a second end overlapping an edge of the touch panel where a controller is disposed.

8. The method of claim 1, wherein the adhering of the base substrate under the electrode wiring comprises:
   coating a photo-hardening resin on a surface where the electrode wiring and the base substrate are to be adhered to each other; and
   radiating a light thereto.

9. The method of claim 8, wherein the photo-hardening resin comprises at least one material selected from the group consisting of a polyester-based resin, an epoxy-based resin, a urethane-based resin, a polyether-based resin, a polyacryl-based resin, an acryl-based resin, and a siloxane-based resin.

* * * * *